United States Patent [19]

Nagatsuma et al.

[11] Patent Number: 4,595,853

[45] Date of Patent: Jun. 17, 1986

[54] APPARATUS FOR AND METHOD OF DETERMINING PROPERTIES OF SAW SUBSTRATES

[75] Inventors: Kazuyuki Nagatsuma, Hachioji; Yukio Ito, Sayama; Hirosi Takeuchi, Matsudo; Sakichi Ashida, Fuchu; Shigeru Jyomura, Tokyo, all of Japan

[73] Assignee: Hitachi, Ltd., Tokyo, Japan

[21] Appl. No.: 552,815

[22] Filed: Nov. 17, 1983

[51] Int. Cl.⁴ ............................................. H01L 41/04
[52] U.S. Cl. .................................. 310/313 D; 324/56; 73/618
[58] Field of Search ......... 73/618; 310/313 A, 313 D; 324/56; 333/153, 195

[56] References Cited

U.S. PATENT DOCUMENTS

| | | | |
|---|---|---|---|
| 4,092,588 | 5/1978 | Desirmiere et al. | 324/56 |
| 4,100,811 | 7/1978 | Cullen et al. | 310/313 B X |
| 4,223,286 | 9/1980 | Ono et al. | 333/195 |
| 4,278,492 | 7/1981 | Cross et al. | 333/195 X |
| 4,314,393 | 2/1982 | Wakatsuki et al. | 324/56 X |
| 4,353,027 | 10/1982 | Ballato et al. | 324/56 |
| 4,382,386 | 5/1983 | Coussot et al. | 310/313 A X |
| 4,409,570 | 10/1983 | Tanski | 310/313 A X |

OTHER PUBLICATIONS

IBM Technical Disclosure Bulletin, vol. 12, No. 10, Mar. 1970, pp. 1699 and 1700.

*Primary Examiner*—Charles Hart
*Attorney, Agent, or Firm*—Antonelli, Terry & Wands

[57] ABSTRACT

An apparatus for and a method of non-destructively determining properties of a SAW substrate, in which first and second interdigital transducers are formed in a spaced relationship on a single common piezoelectric substrate, a blocking member is formed between said transducers on the substrate for preventing an acoustic wave signal from being transferred between said transducers via the common substrate, spacers are provided for supporting a to-be-determined SAW substrate above the common substrate with a spacing left between the SAW substrate and the fingers of transducers, the SAW substrate to be placed on the spacers is positioned with respect to the transducers so that co-directional mode coupling will, in operation, effectively take place between the SAW substrate and the transducers, adherence between the SAW substrate and the spacers is secured to enhance the co-directional mode coupling, an electric signal is applied to the first transducer for transferring, due to the co-directional mode coupling, an acoustic signal to the SAW substrate along the surface of which the acoustic signal will propagate and will be transferred, due to the co-directional mode coupling, to the second transducer, and the output of the second transducer is measured.

19 Claims, 6 Drawing Figures

APPARATUS FOR AND METHOD OF DETERMINING PROPERTIES OF SAW SUBSTRATES

BACKGROUND OF THE INVENTION

The present invention relates to an apparatus for and method of non-destructively and simply determining properties of a surface acoustic wave (SAW) substrate such as a propagation speed or attenuation of surface acoustic waves in the SAW substrate.

A piezoelectric SAW substrate is produced from a wafer which is cut out of a piezoelectric monocrystalline rod. Since wafers cut out of one piezoelectric monocrystalline rod have different compositions, properties of those wafers which are not identical. Accordingly, SAW substrates produced from different wafers usually have different properties. For fabricating a SAW device provided with desired characteristics, it is necessary to determine beforehand properties of a SAW substrate, especially the propagation speed and attenuation of acoustic waves on the surface of the substrate.

In methods of simply determining properties of a piezoelectric SAW substrate without directly forming metal electrode finger patterns on the substrate, as shown in FIG. 1, a first set of interdigital fingers 1 and a second set of interdigital fingers 2 formed on a glass plate 21 are contacted to a to-be-determined piezoelectric SAW substrate 20. This is also described by M. B. Schulz et al. in J. Appl. Phys. 41, 2755, 1970. Otherwise, the first set of interdigital fingers and the second set of interdigital fingers are confronted by the to-be-determined SAW substrate with a spacing as described by M. K. Roy in J. Phys. E: Scientific Instruments 9, 148, 1976. Since these methods exhibit low efficiency conversion and coupling of surface acoustic waves, they cannot be applied to high precision determination of a propagation speed of surface acoustic waves.

SUMMARY OF THE INVENTION

An object of the present invention is to provide an apparatus for and method of non-destructively determining with high precision properties of a SAW substrate made of, for example, $LiNbO_3$, $LiTaO_3$ or the like.

Another object of the present invention is to provide an apparatus for and method of simply determining with high precision properties of a SAW substrate.

To attain the above described object, the inventors noted the co-directional mode coupling effect of surface acoustic waves. When two piezoelectric members having nearly equal propagation speeds of surface acoustic waves are confronted to each other with a spacing over a suitable coupling length (overlap length), a good coupling efficiency of surface acoustic waves between those two piezoelectric members is obtained. As a result, surface acoustic waves propagating in one of the two piezoelectric members as traveling waves induce surface acoustic waves propagating in the other of the two piezoelectric member. This phenomenon is called the co-directional mode coupling effect. W. L. Bond et al. theoretically and experimentally ascertained the co-directional mode coupling effect by using a variable delay line composed of two piezoelectric members 22 and 22' having identical properties as illustrated in FIG. 2 (Appl. Phys. Letters Vol. 14, No. 4, 1969, pp. 122-124. Similarly to FIG. 1, reference numerals 1 and 2 illustrated in FIG. 2 denote sets of interdigital fingers formed on the piezoelectric members 22 and 22'. However, the above described reference reports only an experiment for checking whether transfer of surface acoustic waves between two piezoelectric members having identical properties is possible or not. And application of the co-directional mode coupling effect to determination of properties of a SAW substrate is not described at all.

The principal feature of the present invention is that a to-be-determined SAW substrate is intended to be placed with respect to a first interdigital transducer including a piezoelectric substrate and a set of interdigital fingers formed on the surface of the substrate and with respect to a second interdigital transducer including a piezoelectric substrate and a set of interdigital fingers formed on the surface of the substrate in such a manner that a spacing is left between the to-be-determined SAW substrate and the substrates of the first and second interdigital transducers and at least a portion of each of the substrates of the transducers overlaps the SAW substrate thereby to cause the above described co-directional mode coupling for surface acoustic waves, the first interdigital transducer being a predetermined distance spaced from and accoustically isolated from the second interdigital transducer. This arrangement enhances the efficiency in conversion and coupling of surface acoustic waves. As a result, it becomes possible to determine non-destructively and simply properties of a SAW substrate with high precision.

DESCRIPTION OF THE PREFERRED EMBODIMENTS

Figure 1:
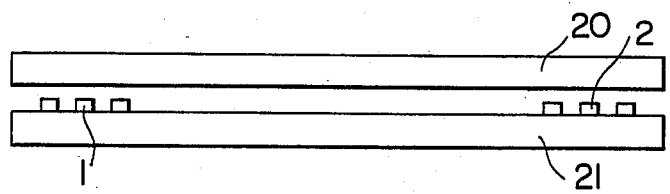
FIG. 1 is a sectional view for illustrating determination of properties of an SAW substrate using a glass plate according to the prior art.
Figure 2:
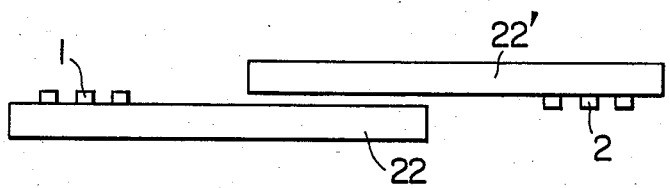
FIG. 2 is a sectional view for illustrating the manner of exciting surface acoustic waves using codirectional made coupling according to the prior art.
Figure 3:
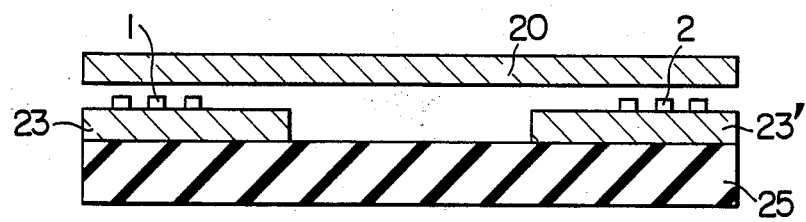
FIG. 3 is a sectional view for illustrating an embodiment of the present invention.

Referring to FIG. 3, reference numeral 25 represents a support made of glass, bakelite or metal, on which are fixedly arranged a first interdigital transducer including a piezoelectric substrate 23 and a set of interdigital fingers 1 and a second interdigital transducer including a piezoelectric substrate 23' and a set of interdigital fingers 2 formed thereon, the first and second interdigital transducers being a predetermined distance spaced from each other on the support. For determination of properties of a to-be-determined SAW substrate 20, it is placed on the first and second interdigital transducers in such a manner that there is left a spacing between the SAW substrate 20 and the substrates 23 and 23' and at least a portion of each of the interdigital transducers overlaps the SAW substrate 20 thereby to cause co-directional mode coupling between the SAW substrate 20 and the first and second interdigital transducers.

Upon excitation of the first interdigital transducer including the substrate 23 and the fingers 1, acoustic waves generated by the first interdigital transducer are moved or transferred to the SAW substrate 20 due to the co-directional mode coupling and propagate in the SAW substrate 20. When they reach that portion of the SAW substrate 20 which is over the second interdigital transducer including the substrate 23' and the fingers 2, they are moved or transferred back to the second interdigital transducer due to the co-directional mode coupling. A portion of the acoustic waves generated by the first interdigital transducer propagate in the substrate 23 towards the second interdigital transducer. This acoustic wave portion being an unnecessary component for determination of properties of the SAW substrate 20, means should be provided for preventing such unnecessary component from reaching the second interdigital transducer. In FIG. 3, however, since the substrate 23 of the first interdigital transducer is isolated from the substrate 23' of the second interdigital transducer and the support 25 is made of a non-piezoelectric material, there is no need of providing separately such preventing means. Thus, the support 25 is made of a material different from that of the substrates 23 and 23' so that the first and second interdigital transducers are not coupled accoustically.

Figure 4:
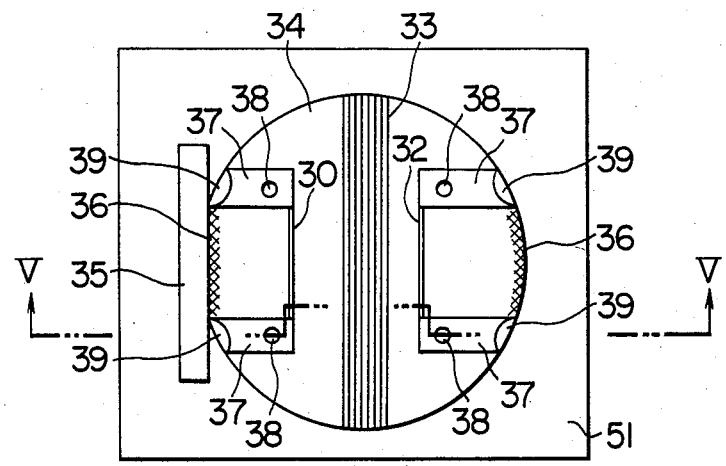
FIG. 4 is a top view for illustrating another embodiment of the present invention.
Figure 5:
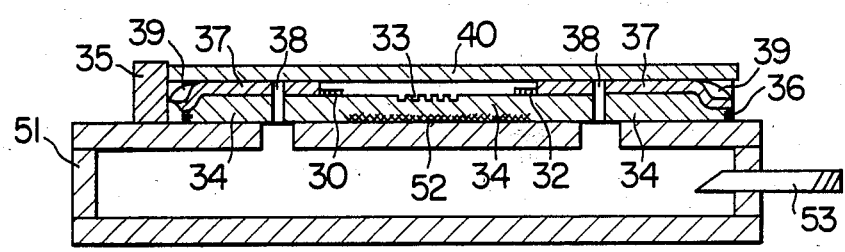
FIG. 5 shows an enlarged sectional view taken along line V—V illustrated in FIG. 4 together with a to-be-determined SAW substrate.

Referring next to FIGS. 4 and 5 which respectively illustrate the top view and enlarged sectional view of another embodiment of an apparatus for determining properties of a SAW substrate according to the present invention, reference numeral 34 denotes a single common piezoelectric substrate made of LiBnO₃ nearly taking the shape of a disc which is 2 mm in thickness and 50 mm in diameter. This common piezoelectric substrate 34 has as its main surface a surface which is obtained by rotating the Y-plane by 128° towards the Z-axis around the X-axis functioning as the rotation axis. A SAW signal propagates in the X-axis direction. (A piezoelectric substrate having such a main surface and a SAW propagation direction is hereinafter referred to as a 128° rotated YX plate.) The main surface of the common substrate 34 is mirror-polished. On the main surface thus polished, two sets of normal type interdigital fingers 30 and 32 respectively having a thickness of 0.5 μm, a width of 17 μm, an interdigital spacing of 17 μm, an aperture of 16 mm and five pairs are formed by using photolithography. Those interdigital fingers are made of Al, for example. In this way, a first interdigital transducer is formed on a first portion of one main surface of the common substrate 34. And on a second portion of the common substrate 34 which is a predetermined distance spaced from the first portion, a second interdigital transducer is formed. Additionally on the main surface of the common substrate 34, electrode layers 37 used for external connection of the first and second interdigital transducers are so formed as to keep electrical connection with interdigital fingers 30 and 32 included in respective interdigital transducers and have a thickness of 1.0 μm, for example, which is larger than that of the fingers. As described later, the electrode layers 37 serve not only as electrodes for the fingers 30 and 32 included in the first and second interdigital transducers but also as spacer means. On a third portion existing between the first and second interdigital transducers on the main surface of the common substrate 34, a grating 33 having a plurality of parallel slots arranged with a pitch of 1 mm is formed by using a diamond cutter. The number of the parallel slots is ten, which may be, for example, a positive integer times the wavelength of the SAW signal. Each of the slots has a width of 0.3 mm and a depth of 0.2 mm which may be, for example, an integer times the wavelength of the SAW signal. The direction of the length of the slots should not be at right angles (should not be perpendicular) but may be at, say, 88° with respect to the propagation direction of a SAW signal. The grating prevents a SAW signal produced by one of the interdigital transducers from propagating in the common substrate and reaching the other of the interdigital transducers. These slots may not be parallel with each other. At each of the opposing ends of the common substrate to which a SAW signal may reach, a fine rugged portion 36 is formed over a width larger than the length of the interdigital fingers for the purpose of canceling an undesirable reflected SAW signal. Instead of the rugged portions, end faces which are not perpendicular to the propagation direction of a SAW signal may be formed on both ends of the common substrate. At each of the electrode layers 37 located on ends of the common substrate, a step 39 which is higher than the surface of the electrode layer is formed, whereto a lead wire which is not illustrated is attached by using silver paste. On the central part of each electrode layer 37, a through hole 38 which may be 1.7 mm in diameter is provided for vacuum adhesion. The common substrate 34 is held above a vacuum vessel 51, for example, by using the pneumatically operable through holes. Reference numeral 52 denotes a roughened surface portion which is formed on the other main surface of the common substrate 34 opposite to the one main surface having the two sets of interdigital fingers 30 and 32. The roughened surface portion 52 is formed between the two interdigital transducers and serves to prevent a SAW signal produced in one of the interdigital transducers from propagating in the common substrate 34 and being transferred to the other of the interdigital transducers. This roughened surface portion 52 is not essentially required but is desirable for enhancing the precision of the property determination.

A to-be-determined SAW substrate 40 is mounted on the electrode layer 37 which also serves as spacer means of the apparatus for determining properties illustrated in FIG. 4. The to-be-determined SAW substrate 40 is a YX plate made of LiNbO₃ which is 0.5 mm in thickness and 50 mm in diameter and is mirror-polished. By using positioning means such as an orientation flat guide 35, the crystallographic orientation and the propagation direction of a SAW signal of the to-be-determined SAW substrate 40 are registered with those of the common substrate 34, and other necessary physical arrangement relations are attained. As shown in FIG. 5, the to-be-determined SAW substrate 40 is placed with a spacing left between the SAW substrate 40 and the common substrate 34 and with the crystallographic orientation of the SAW substrate registered with that of the common substrate 34. In operation, therefore, co-directional mode coupling takes place between the to-be-determined SAW substrate 40 and two interdigital transducers on the common substrate 34. It is desirable to make the common substrate 34 of the same material as that of the to-be-determined substrate 40 as described above in order to enhance the co-directional mode coupling and hence the determination precision. After the to-be-determined SAW substrate 40 is mounted on the apparatus for determining properties as described, the substrate 40 is sucked toward the common substrate 34 to decrease the spacing between the substrate 40 and the common substrate 34 by using a vacuum pump (not shown) which is connected to the vacuum vessel 51. As a result, the substrate 40 is adhered to the spacer (namely the electrode layer 37) to increase the contact area, the co-directional mode coupling being enhanced. Consequently, the substrate 40 is confronted by the common substrate 34 with a spacing of approximately 1 μm. Referring to FIG. 5, the effective component of the SAW signal produced by the input interdigital transducer 30 on the common substrate 34 propagates in the common substrate 34 towards the output interdigital transducer 32. Prior to reaching the grating 33, part of the energy of the propagated SAW signal is transferred onto the to-be-determined SAW substrate 40 which is placed in parallel to the common substrate 40 by the co-directional mode coupling. The remaining part of the energy is subjected to diffused reflection at slots included in the grating 33. Therefore, the remaining part of the energy is not supplied to the output interdigital transducer including fingers 32 via the common substrate 34 instead of the substrate 40. Even if a SAW signal propagating in the common substrate 34 exists, it does not reach the output interdigital transducer due to diffused reflection at the roughened surface portion 52. The effective component transferred to the to-be-determined substrate 40 continues to travel on the surface thereof. Since there is no obstacle such as a slot, the effective component reaches that portion of the SAW substrate 40 which is above the output interdigital transducer 32. Owing to the co-directional mode coupling between the substrate 40 and the output interdigital transducer 32, the effective part of the energy which has reached above the output interdigital transducer 32 is transferred from the substrate 40 to the output interdigital transducer 32 to be converted to an electrical signal there as a received signal. Here, a sinusoidal wave signal of 52 to 63 MHz was applied to the input interdigital transducer 30 and the voltage received at the output interdigital transducer was observed by using a vector voltmeter. From the resultant phase-frequency characteristics, a delay time was calculated. Then the distance between input and output interdigital transducers was divided by the delay time to yield the propagation speed. The insertion loss in this embodiment of the present invention was 28 dB, exceeding the loss in the prior art by 10 dB or more. By means of the value of the insertion loss, it is possible to check the cutting quality, property, dirt on the surface or the like of the substrate 40.

Figure 6:
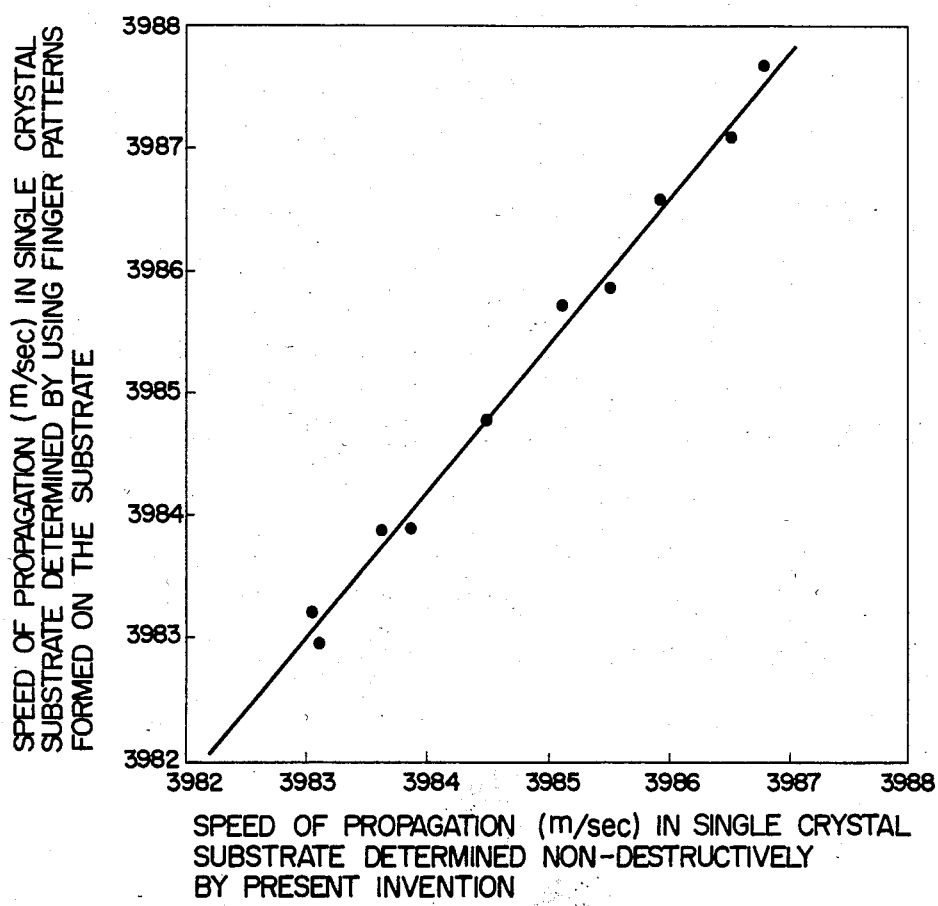
FIG. 6 is a graph for illustrating comparison between values determined by the present invention and those determined by the use of finger patterns formed on the substrate.

As the to-be-determined monocrystalline plate 40 composed of LiNbO$_3$, a monocrystalline plate cut out of a monocrystal which has been brought up from a solution having a mol ratio expressed as Li/(Li+Nb)=49.0 was employed. At first, the propagation speed of a SAW signal was determined by using the apparatus for and method of determining properties according to the present invention. Thereafter, patterns of interdigital fingers were directly formed on the monocrystalline plate. Then, the propagation speed of a SAW signal on that monocrystalline plate with the pattern directly formed thereon was determined under the same condition as that of the method according to the present invention. FIG. 6 shows the correspondence between results determined by means of the above described two methods. Dots illustrated in FIG. 6 represent values obtained by using two determination methods. As apppreciated from FIG. 6, the apparatus for and method of determining properties of SAW substrates according to the present invention do not yield exactly same values as those obtained by a conventional method in which interdigital patterns are directly formed. However, one-to-one correspondence may be found between values obtained by two determination methods. In addition, the method according to the present invention has high precision so that the determined value of 1 m/s (approximately ±0.25%) may be separated.

In this embodiment of the present invention, it is possible to determine in an extremely short time properties of SAW substrates with a precision which is as high as that of a method in which interdigital finger patterns are directly formed and a long determination time was required.

In the above described embodiment, a vacuum vessel using pneumatic pressure is employed as the means for providing adherence of the to-be-determined substrate 40 to spacer means 37 for the purpose of enhancing the co-directional mode coupling. Instead of the vacuum vessel, a weight using gravity may be used. Instead of using the electrode layer as the spacer means 37, it is possible to use a plurality of spacers for supporting the to-be-determined substrate 40 above the common substrate 34 with a small spacing left between the SAW substrate 40 and the substrate 34, though the spacers are not essential. Further, instead of the grating employed as means for preventing a SAW signal produced by the first (input) interdigital transducer from propagating in the common substrate 34 to be received by the second (output) interdigital transducer, it is possible to employ a film which is composed of an acoustic absorption material such as Si paste and plastic subjected to ultraviolet vulcanization treatment and which is formed on the third portion of the main surface of the common substrate.

As heretofore described, the present invention provides non-destructive, simple and high-precision method of determining SAW properties of the substrate material used for SAW devices.

We claim:

1. An apparatus for non-destructively determining properties of a surface acoustic wave (SAW) substrate, comprising:
   a first interdigital transducer for converting an electrical signal to a surface acoustic wave (SAW) signal and a second interdigital transducer for converting a SAW signal to an electric signal, said first and second transducers having piezoelectric substrates and being a predetermined distance spaced apart from each other;
   means for releasably holding a to-be-determined SAW substrate so that said piezoelectric substrates of said first and second interdigital transducers at least partially overlap said to-be-determined SAW saubstrate with a spacing therebetween for co-directional mode coupling of an acoustic wave signal from the piezoelectric substrate of said first transducer with said to-be-determined SAW substrate and from said to-be-determined SAW substrate with the piezoelectric substrte of said second transducer so as to enable non-destructive determination of the properties of said to-be-determined SAW substrate: and
   means provided between said first and second transducers for preventing that portion of the acoustic wave signal produced by said first transducer which does not propagate in said to-be-determined SAW substrate from reaching said second transducer.

2. An apparatus according to claim 1, further comprising means for measuring the acoustic wave signal received at said second transducer so as to provide an output indicative thereof as an indication of the properties of said to-be-determined SAW substrate.

3. An apparatus for non-destructively determining properties of a surface acoustic wave (SAW) substrate, comprising:

an input interdigital transducer for converting an electric signal to a surface acoustic wave (SAW) signal and an output interdigital transducer for converting a SAW signal to an electric signal, said input and output transducers having interdigital fingers formed on first and second portions of one main surface of a piezoelectric substrate, respectively, said first and second portions being a predetermined distance spaced apart from each other;

means for releasably holding a to-be-determined SAW substrate so that said first and second portions of the main surface of said piezoelectric substrate at least partially overlap said to-be-determined SAW substrate with a spacing therebetween for co-directional mode coupling of an acoustic wave signal from the first portion of the main surface of said piezoelectric substrate with said to-be-determined SAW substrate and from said to-be-determined SAW substrate with the second portion of the main surface of said piezoelectric substrate so as to enable non-destructive determination of the properties of said to-be-determined SAW substrate; and grating means provided between said first and second transducers on the main surface of said piezoelectric substrate for preventing the acoustic wave signal produced by said first transducer and propagating in said piezoelectric substrate from reaching said second transducer.

4. An apparatus according to claim 3, further comprising means for measuring the acoustic wave signal received at said second transducer so as to provide an output indicative thereof as an indication of the properties of said to-be-determined SAW substrate.

5. An apparatus for non-destructively determining properties of a surface acoustic wave (SAW) substrate, comprising:

a first interdigital transducer for converting an electrical signal to a surface acoustic wave (SAW) signal and a second interdigital transducer for converting a SAW signal to an electric signal, said first and second transducers having interdigital fingers formed on first and second portions of one main surface of a single common piezoelectric substrate, respectively, said first and second portions being a predetermined distance spaced apart from each other;

means provided between said first and second transducers on the main surface of said common substrate for preventing an acoustic wave signal produced by said first transducer and propagating in said common substrate from reaching said second transducer;

spacer means for releasably supporting a to-be-determined SAW substrate above said common substrate with a spacing left between said SAW substrate and said common substrate and with said first and second portions of the main surface of said single common substrate at least partially overlapping said SAW substrate; and means for positioning said SAW substrate for co-directional mode coupling between said SAW substrate and said first and second portions of the main surface of said single common substrate.

6. An apparatus according to claim 5, further comprising means for measuring the acoustic wave signal received at said second transducer so as to provide an output indicative thereof as an indication of the properties of said to-be-determined SAW substrate.

7. An apparatus according to claim 5, further comprising means for measuring the acoustic wave signal received at said second transducer so as to provide an output indicative thereof as an indication of the properties of said to-be-determined SAW substrate.

8. An apparatus according to claim 5, further comprising means for providing adherence of said SAW substrate to said spacer means to enhance said co-directional mode coupling.

9. An apparatus according to claim 8, in which said adherence providing means includes a vacuum vessel, and said common substrate is mounted on said vacuum vessel.

10. An apparatus according to claim 8, in which each of said first and second transducers has electrically conductive means formed on said common substrate, said electrically conductive means having a thickness larger than that of the fingers of said transducers to serve not only as electrodes for said transducers but also as said spacer means.

11. An apparatus according to claim 10, in which said adherence providing means includes a vacuum vessel, said common substrate is mounted on said vacuum vessel, and common substrate and said electrically conductive means have a plurality of through holes for pneumatic communication with said vacuum vessel for said adherence of said SAW substrate to said spacer means.

12. An apparatus according to claim 5, in which said preventing means includes a grating having a plurality of slots formed on a third portion of the main surface of said common substrate between said first and second portions, the direction of the length of said slots being not perpendicular to the propagation direction of a SAW signal along the main surface of said common substrate.

13. An apparatus according to claim 5, in which said preventing means includes a film of an acoustic absorbing material formed on a third portion of the main surface of said common substrate between said first and second portions.

14. An apparatus for non-destructively determining properties of a surface acoustic wave (SAW) substrate, comprising:

a single common piezoelectric substrate;

a first set of interdigital fingers and a second set of interdigital fingers respectively formed in a spaced relationship with each other on one main surface of said common piezoelectric substrate to constitute a first interdigital transducer for acoustic-ekectric energy conversion and a second transducer for electric-acoustic energy conversion;

means formed between said first and second finger sets on the mains surface of said common substrate for preventing an acoustic wave signal produced by said first transducer from propagating in said common substrate and reaching said second transducer;

spacer means for releasably supporting a to-be-determined SAW substrate above said common substrate with a spacing left between said SAW substrate and said common substrate and with said first and second portions of the main surface of said single common substrate at least partially overlapping said SAW substrate;

means for positioning said to-be-determined SAW substrate for co-directional mode coupling between said to-be-determined SAW substrate and first and second portions of the main surface of said single common substrate; and means for providing adherence of said SAW substrate to said spacer means to enhance said co-directional mode coupling.

15. An apparatus according to claim 14, in which said preventing means includes a grating having a plurality of slots formed between said first and second sets of fingers on said one main surface of said common substrate, the direction of the length of said slots being not parallel to the propagation direction of a SAW signal along said common substrate, and includes a roughened surface formed on that portion of the other main surface of said common substrate which is between said first and second sets of fingers.

16. A method of non-destructively determining properties of a surface acoustic wave (SAW) substrate by using the apparatus set forth in claim 3, comprising the steps of:

placing a to-be-determined SAW substrate on said spacer means with a spacing left between said SAW substrate and said common substrate, with said first and second portions of the main surface of said single common substrate at least partially overlapping said SAW substrate, and with the crystallographic orientation of said SAW substrate registered with that of said common substrate with the aid of said positioning means, thereby arranging said SAW substrate and said first and second transducers for co-directional mode coupling between said SAW substrate and said first and second portions of the main surface of said single common substrate;

exerting pressure on said SAW substrate to secure adherence of said SAW substrate to said spacer means, thereby decreasing said spacing between said SAW substrate and said fingers of said transducers for enhancing said co-directional mode coupling; and applying an electric signal to said first transducer to generate an acoustic wave signal and transfer it to said SAW substrate due to said co-directional mode coupling and measuring the output of said second transducer having received an acoustic signal transferred from said SAW substrate due to said co-directional mode coupling.

17. A method according to claim 16, in which said pressure is pneumatic pressure.

18. A method according to claim 16, in which said pressure includes pressure produced by gravitational force.

19. A method according to claim 16, further comprising the step of utilizing the measured output of said second transducer as an indication of the properties of said SAW substrate.

* * * * *